United States Patent
Tsujikawa et al.

(10) Patent No.: US 9,575,413 B2
(45) Date of Patent: Feb. 21, 2017

(54) EXPOSURE APPARATUS, EXPOSURE METHOD, AND DEVICE MANUFACTURING METHOD

(71) Applicant: CANON KABUSHIKI KAISHA, Tokyo (JP)

(72) Inventors: Takuro Tsujikawa, Utsunomiya (JP);
Atsushi Kawahara, Utsunomiya (JP);
Issei Funayoshi, Utsunomiya (JP);
Shinichi Egashira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/715,875

(22) Filed: May 19, 2015

(65) Prior Publication Data

US 2015/0338746 A1    Nov. 26, 2015

(30) Foreign Application Priority Data

May 22, 2014    (JP) .................................. 2014-106457

(51) Int. Cl.
*G03B 27/52*    (2006.01)
*G03F 7/20*    (2006.01)

(52) U.S. Cl.
CPC ....... *G03F 7/70191* (2013.01); *G03F 7/70425* (2013.01)

(58) Field of Classification Search
CPC .............. G03F 7/70191; G03F 7/70425; G03F 7/70433

USPC ....................................................... 355/55, 53
See application file for complete search history.

(56) References Cited

U.S. PATENT DOCUMENTS

2005/0041226 A1*  2/2005  Tanaka ................ G03F 7/70241
                                                         355/53
2009/0040480 A1*  2/2009  Kawashima ........ G03F 7/70425
                                                         355/27

FOREIGN PATENT DOCUMENTS

JP        2003092252 A        3/2003
JP        2005003965 A        1/2005

* cited by examiner

*Primary Examiner* — Peter B Kim
(74) *Attorney, Agent, or Firm* — Rossi, Kimms & McDowell LLP

(57) ABSTRACT

An exposure apparatus sequentially performs exposure in each of a plurality of underlying shot regions formed on a substrate and includes a controller. The controller is configured to judge, for each of the plurality of shot regions, whether to perform one-shot exposure without dividing the shot region or divided exposure, based on information of respective shapes of the plurality of shot regions, determine a shape of each partial region in the shot region in which the divided exposure is to be performed, and control the exposure so as to perform the one-shot exposure or the divided exposure in each of the plurality of shot regions based on a result of the judgment and the determined shape of each partial region.

13 Claims, 6 Drawing Sheets

F I G. 5
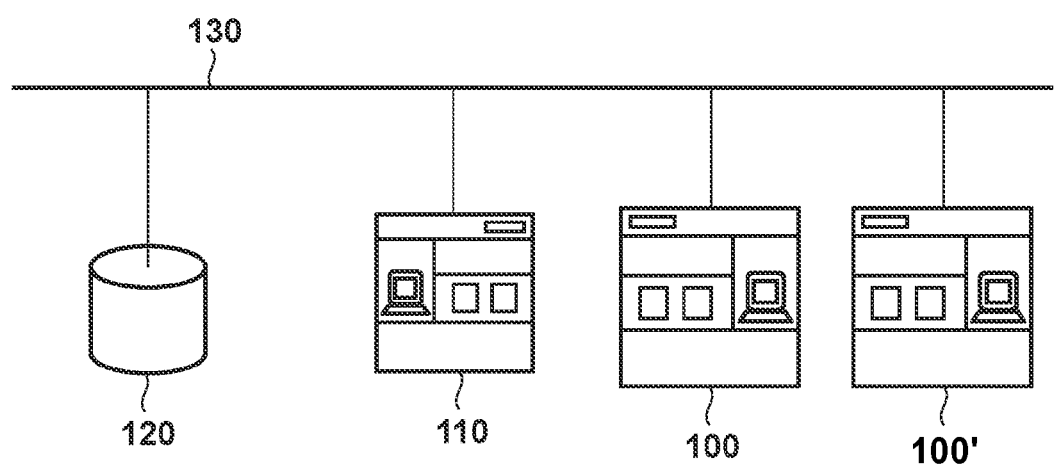

EXPOSURE APPARATUS, EXPOSURE METHOD, AND DEVICE MANUFACTURING METHOD

BACKGROUND OF THE INVENTION

Field of the Invention

The present invention relates to exposure apparatuses, exposure methods, and device manufacturing methods.

Description of the Related Art

Conventionally, alignment in a semiconductor exposure apparatus (a so-called "stepper" or the like) measures positions or positional error related to several shot regions set in advance on a substrate such as a semiconductor wafer, and a shot arrangement is then determined for the respective shot regions based thereon. What is known as "global alignment" is employed, where the respective shot regions are aligned in order on the wafer in positions corresponding to a master plate such as a reticle using the determined shot arrangement.

In addition to global alignment, magnification components and rotation components of the shot regions themselves are being corrected, with the aim of correcting distortion in the shapes of the shot regions caused by increased complexity in the manufacturing process, complexity that is a result of finer sizes, higher levels of integration, and higher angles of view being established in semiconductors. Such a technique is disclosed in Japanese Patent Laid-Open No. 2003-92252. A process of cutting a wafer thin, a process of laminating a thinned wafer to a support substrate under pressure, and so on are known as processes that produce distortion in the shapes of the shot regions. Meanwhile, Japanese Patent Laid-Open No. 2005-3965 proposes divided exposure, which divides a wafer into several exposure regions in accordance with positional deviation and exposes those regions rather than exposing the entirety of a single exposure region on the wafer, with the aim of further improving the precision of alignment.

However, wafers processed in a step-and-repeat semiconductor exposure apparatus have a large number of shot regions, and thus it is often the case that measuring alignment marks necessary for correcting distortion in the shapes of the shot regions takes time. There has thus been a problem in that correcting distortion in the shapes of the shot regions greatly reduces the throughput. There is an additional problem in that divided exposure makes it necessary to calculate the shapes of the regions obtained through the division, position deviation amounts, and so on, which reduces the throughput even further.

SUMMARY OF THE INVENTION

The present invention provides a exposure apparatus useful in correcting the shape of a shot region.

The present invention in its one aspect provides an exposure apparatus of sequentially performing exposure in each of a plurality of underlying shot regions formed on a substrate, the apparatus comprising: a controller configured to judge, for each of the plurality of shot regions, whether to perform one-shot exposure that exposes the shot region in one shot without dividing the shot region or divided exposure that divides the shot region into a plurality of partial regions and exposes each of the partial regions separately, based on information of respective shapes of the plurality of shot regions, determine a shape of each partial region in the shot region in which the divided exposure is to be performed, and control the exposure so as to perform the one-shot exposure or the divided exposure in each of the plurality of shot regions based on a result of the judgment and the determined shape of each partial region.

Further features of the present invention will become apparent from the following description of exemplary embodiments with reference to the attached drawings.

BRIEF DESCRIPTION OF THE DRAWINGS

FIG. 5 is a diagram illustrating an exposure apparatus and a network.

DESCRIPTION OF THE EMBODIMENTS

Exemplary embodiments of the present invention will be described in detail hereinafter based on the appended drawings. Note that the present invention is not intended to be limited to the following embodiments, which are merely specific examples useful in carrying out the present invention. Furthermore, all combinations of features described in the following embodiments are not necessarily required for the present invention to solve the problems mentioned above.

First Embodiment

Figure 1:
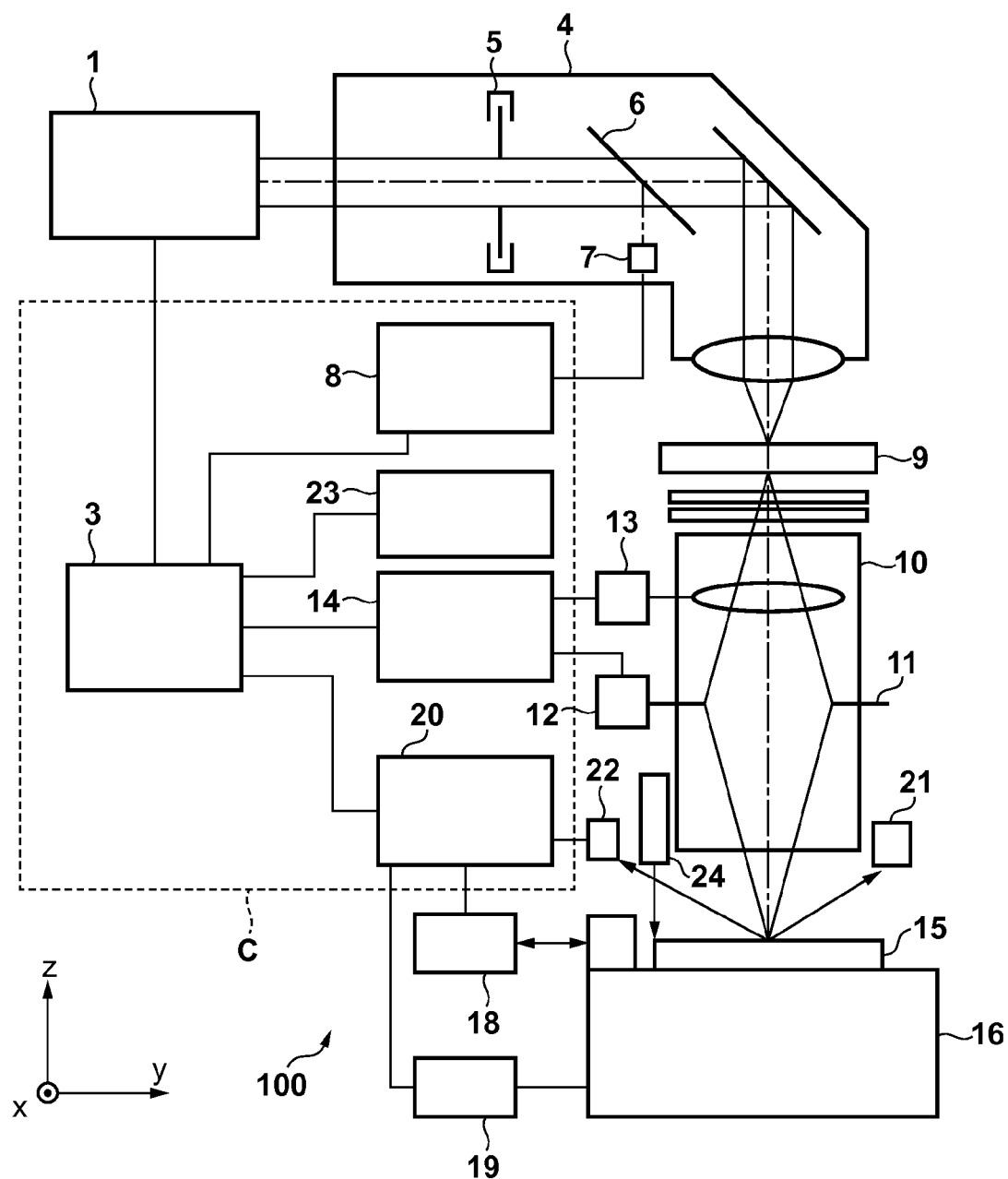
FIG. 1 is a diagram illustrating an overview of an exposure apparatus.

FIG. 1 is a diagram illustrating an overview of an exposure apparatus 100 that sequentially exposes each of a plurality of underlying shot regions formed on a substrate. A light source 1 can output light in a plurality of wavelength bands as exposure light. The light emitted from the light source 1 is shaped into a predetermined beam shape via an optical system (not shown) that forms an illumination optical system 4. The shaped beam is incident on an optical integrator (not shown), and here, multiple two-dimensional light sources are formed for illuminating a reticle (mask) 9 serving as a master plate, mentioned later, at a uniform illumination distribution. A light-shielding plate 5 is disposed in an optical path of the illumination optical system 4, forming a desired illumination area on the reticle 9. The light-shielding plate 5 constitutes a light-shielding portion that shields regions aside from partial regions to be exposed, which will be mentioned later, from exposure.

A half mirror 6 is disposed in the optical path of the illumination optical system 4, and some of the exposure light that illuminates the reticle 9 is reflected by the half mirror 6 and extracted. A photo sensor 7 for exposure light is disposed in an optical path of the light reflected by the half mirror 6, and the photo sensor 7 produces an output corresponding to an intensity of the exposure light (an exposure energy).

A circuit pattern for a semiconductor device that is to be printed is formed on the reticle 9, and is irradiated by the illumination optical system 4. A refractive or catadioptric projection optical system 10 reduces an image of the pattern on the reticle 9 by a reduction rate $\beta$ ($\beta=\frac{1}{2}$, for example), and is disposed so as to project onto a single shot region on a photosensitive substrate (wafer) 15 that has been applied with a photoresist.

An aperture stop 11 having an almost circular opening is disposed on a pupil plane of the projection optical system 10 (a Fourier transform plane for the reticle 9), and can be set to a predetermined value by controlling a diameter of the opening using a driving unit 12 such as a motor or the like. A driving unit 13 moves an optical element that forms part of a lens system in the projection optical system 10 along an optical axis of the projection optical system 10. Through this, a favorable projection rate is achieved and distortion error is reduced while preventing an increase in various aberrations in the projection optical system 10. A projection optical system controller 14 controls the driving of the driving unit 12 and the driving unit 13 under the control of a main controller 3.

A stage (wafer stage) 16 that holds the wafer 15 is capable of moving and rotating along at least a plane that is perpendicular to the optical axis of the projection optical system 10. In the first embodiment, the wafer stage 16 is capable of moving in three-dimensional directions, and can move in the direction of the optical axis of the projection optical system 10 (a Z direction) as well as within a plane orthogonal to that direction (an X-Y plane). Here, a direction parallel to the optical axis of the projection optical system 10 and moving from the wafer 15 toward the reticle 9 is taken as a Z axis, and the directions orthogonal thereto are taken as an X axis and a Y axis. The Y axis follows the plane of the drawings on the paper, whereas the X axis is perpendicular to the drawing plane and faces toward the viewer of the drawing. A position of the wafer stage 16 in the X-Y plane is detected by using a laser interferometer 18 to measure a distance from a moving mirror anchored to the wafer stage 16. Meanwhile, position deviation between the wafer 15 and the wafer stage 16 is measured using an alignment measurement system 24.

A stage controller 20 that is under the control of the main controller 3 of the exposure apparatus moves the wafer stage 16 to a predetermined position in the X-Y plane by controlling a driving unit 19 such as a motor based on a result of the aforementioned measurement. The main controller 3, the projection optical system controller 14, the stage controller 20, and an illumination system controller 8 (mentioned later) constitute a controller C of the exposure apparatus 100. A light projecting optical system 21 and a light receiving optical system 22 constitute a focus plane detection unit. The light projecting optical system 21 projects a plurality of light beams of non-exposure light, to which the photoresist on the wafer 15 is not sensitive, and the light beams are focused on the wafer 15 and reflected. The light beams reflected by the wafer 15 are incident on the light receiving optical system 22. Although not illustrated, a plurality of position detection light-receiving elements are disposed in the light receiving optical system 22 so as to correspond to the respective reflected light beams. The light receiving optical system 22 is configured such that the points of reflection of each light beam on a light-receiving surface of each light-receiving element and on the wafer 15 are almost conjugate. Position deviation of the wafer 15 in the direction of the optical axis of the projection optical system 10 is measured as position deviation of the incident light beams on the position detection light-receiving element within the light receiving optical system 22.

Figure 2A:
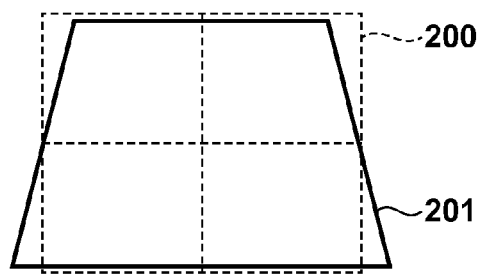
FIGS. 2A to 2C are diagrams illustrating distortion in the shape of a shot region.
Figure 2B:
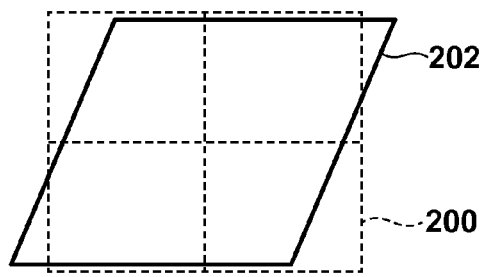
Figure 2C:
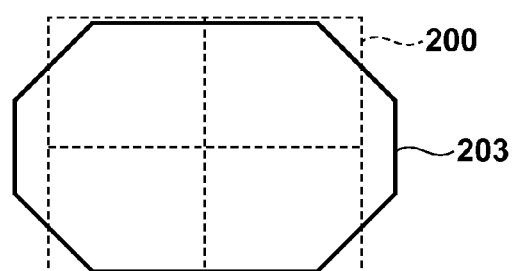

Next, distortion in the shape of a shot region 200 will be described using FIGS. 2A to 2C. FIGS. 2A to 2C are schematic diagrams illustrating a case of trapezoidal distortion, rhomboidal distortion, and barrel distortion, respectively. Although in actuality, distortion having asymmetrical components, rotational components, and so on also occurs, this will be omitted from the present descriptions. Solid line frames 201 to 203 indicate underlying shot regions in which distortion has occurred. A broken line frame 200 indicates a post-positioning exposure region for the case where one-shot exposure, in which the entirety of a shot region is exposed in one shot without dividing the shot region, has been carried out. Differences between the solid line frames and the broken line frames correspond to position deviation, and the deviation amount is typically highest in the four corners of the exposure region.

Figure 3A:
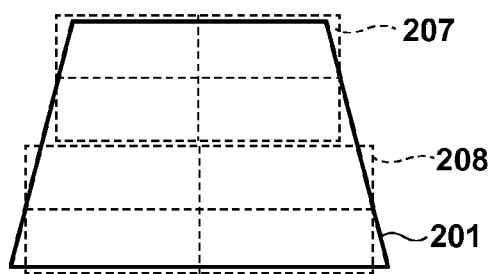
FIGS. 3A to 3C are diagrams illustrating exposure region division.
Figure 3B:
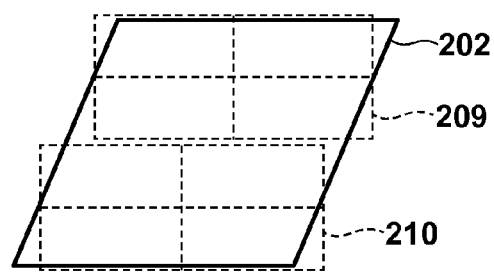
Figure 3C:
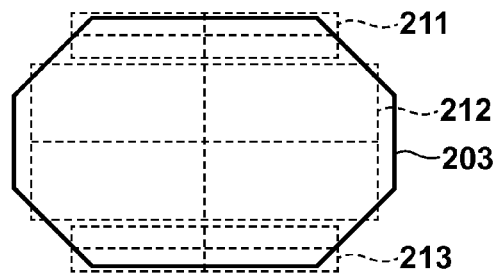

Next, an exposure region in the case where divided exposure, in which the shot region is divided into a plurality of partial regions and exposed on a partial region-by-partial region basis, is carried out will be described using FIGS. 2A to 2C and 3A to 3C. Broken line frames 207 and 208 indicate exposure regions for partial regions obtained in the case where a trapezoidal shot region 201 has been divided vertically into two portions. Broken line frames 209 and 210 indicate exposure regions for partial regions obtained in the case where a rhomboidal shot region 202 has been divided vertically into two portions. Broken line frames 211 to 213 indicate exposure regions for partial regions obtained in the case where a barrel-shaped shot region 203 has been divided vertically into three portions. As shown in FIGS. 3A to 3C, the amounts of position deviation in the case where the shot region is divided and exposed are half the amounts in the cases illustrated in FIGS. 2A to 2C, in which the shot region is exposed without division. In FIGS. 3A to 3C, two exposure regions for two adjacent partial regions are provided so as not to overlap with each other. However, the two exposure regions for the two adjacent partial regions may partially overlap at a border region therebetween.

Figure 4:
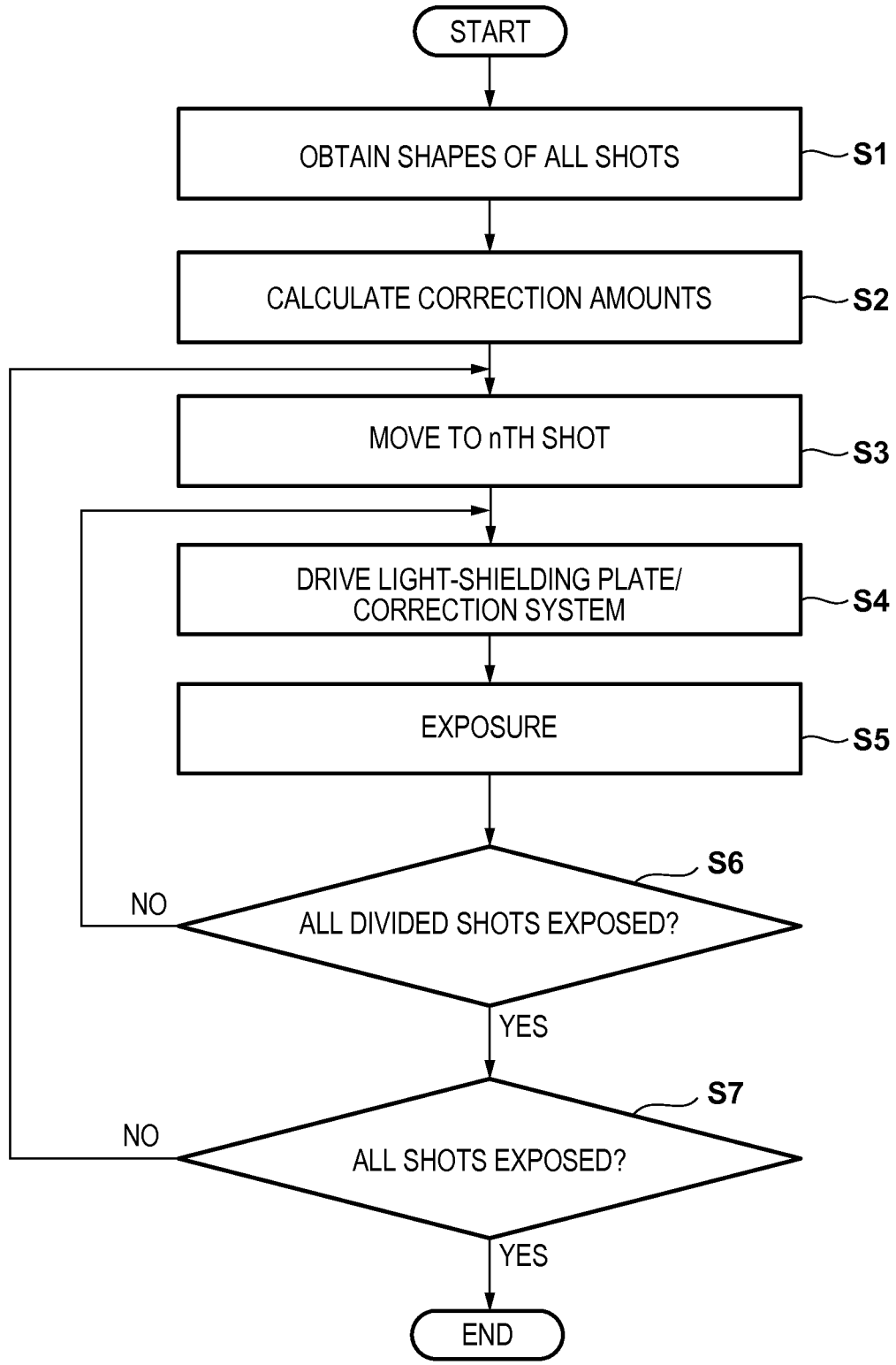
FIG. 4 is a flowchart illustrating an exposure method according to a first embodiment.

Next, an exposure method will be described using FIG. 4.

S1

The main controller 3 obtains information indicating the shape of each underlying shot region and stores this information as shot region shape data in a storage unit 23. The exposure apparatus 100 obtains the shape data of each shot region from an external database 120 over a network 130 to which the exposure apparatus 100 is connected, as indicated in FIG. 5. A surface shape measurement device 110, another exposure apparatus 100', and so on are connected to the network 130. Information of the shapes of the shot regions measured by the surface shape measurement device 110, the exposure apparatuses 100 and 100', and so on is stored in the database 120. In the case where information of the shapes of the shot regions is already stored in the database 120, the exposure apparatus 100 obtains that information. However, in the case where information of the shapes of the shot regions is not stored in the database 120, the exposure apparatus 100 may be configured to measure the shapes of the shot regions using a measurement device provided therein. In the case where the exposure apparatus performs exposure by lots, the result of measuring the shapes of the shot regions in the first wafer 15 of a lot may be used for the other wafers 15 of the lot. Of course, the configuration may be such that the result of the measurement performed by the exposure apparatus 100 is saved in the database 120 connected to the network 130 and used in subsequent exposure processes.

S2

The main controller 3 compares a permitted range of position deviation for production management stored in the storage unit 23 with a position deviation amount in the case where the shot region division calculated from the shapes of the shot regions is not carried out, determines whether or not to carry out divided exposure that divides the shot regions, and stores a result in the storage unit 23. In the case where the shot regions are to be divided, the main controller 3 calculates the shapes of the partial regions obtained by the division, a shift (XY) correction amount and a rotation (θ) correction amount of the wafer stage 16 for positioning each partial region, and a magnification correction amount for the projection optical system 10, and stores these pieces of information in the storage unit 23. In addition, the main controller 3 may similarly calculate and store correction amounts for correction components in other driving units as well. The main controller 3 then determines whether or not to divide the shot regions based on whether or not positioning criteria set in the storage unit 23 is met. The main controller 3 selects a shape of the partial regions obtained by the division from a division pattern group stored in the storage unit 23. S1 and S2 correspond to pre-processing for the exposure process, and the actual exposure process starts from S3.

S3

Once the exposure process is started, the main controller 3 first loads a mth wafer onto the wafer stage 16 and moves to an nth shot region that is the target of the exposure process.

S4

Once movement to the nth shot region is complete, the main controller 3 drives the light-shielding plate 5 via the illumination system controller 8 based on whether or not the shot regions have been divided and on the shapes of the partial regions obtained by the division as stored in the storage unit 23. At the same time, the main controller 3 drives the wafer stage 16 via the stage controller 20 based on the XYθ correction amounts for the wafer stage 16 stored in the storage unit 23. The main controller 3 furthermore drives the driving unit (magnification adjusting mechanism) 13 via the projection optical system controller 14 based on the magnification correction amount of the projection optical system 10 stored in the storage unit 23.

S5

The main controller 3 carries out one-shot exposure on the nth shot region in the case where there are no shot region divisions in the nth shot region. In the case where there are shot region divisions in the nth shot region, the main controller 3 carries out divided exposure for each of the partial regions obtained by the division.

S6

The main controller 3 repeats S4 and S5 until the divided exposure ends for all of the shot regions obtained by division. Once all divided exposures have ended, the process moves to S7.

S7

The main controller repeats S3 to S6 until all shot regions are exposed. Once all shot regions have been exposed, the main controller 3 unloads the wafer 15. In the case where there is another wafer to be exposed, the next wafer is loaded onto the wafer stage 16, and S3 to S7 are repeated.

According to an exposure method based on this flow, even if divided exposure is carried out, the obtainment of the shapes of all the shot regions (S1) and the calculation of the correction amounts (S2), which take time, are executed prior to the start of the exposure process, which makes it possible to reduce a drop in the throughput of the exposure process.

Second Embodiment

Figure 6:
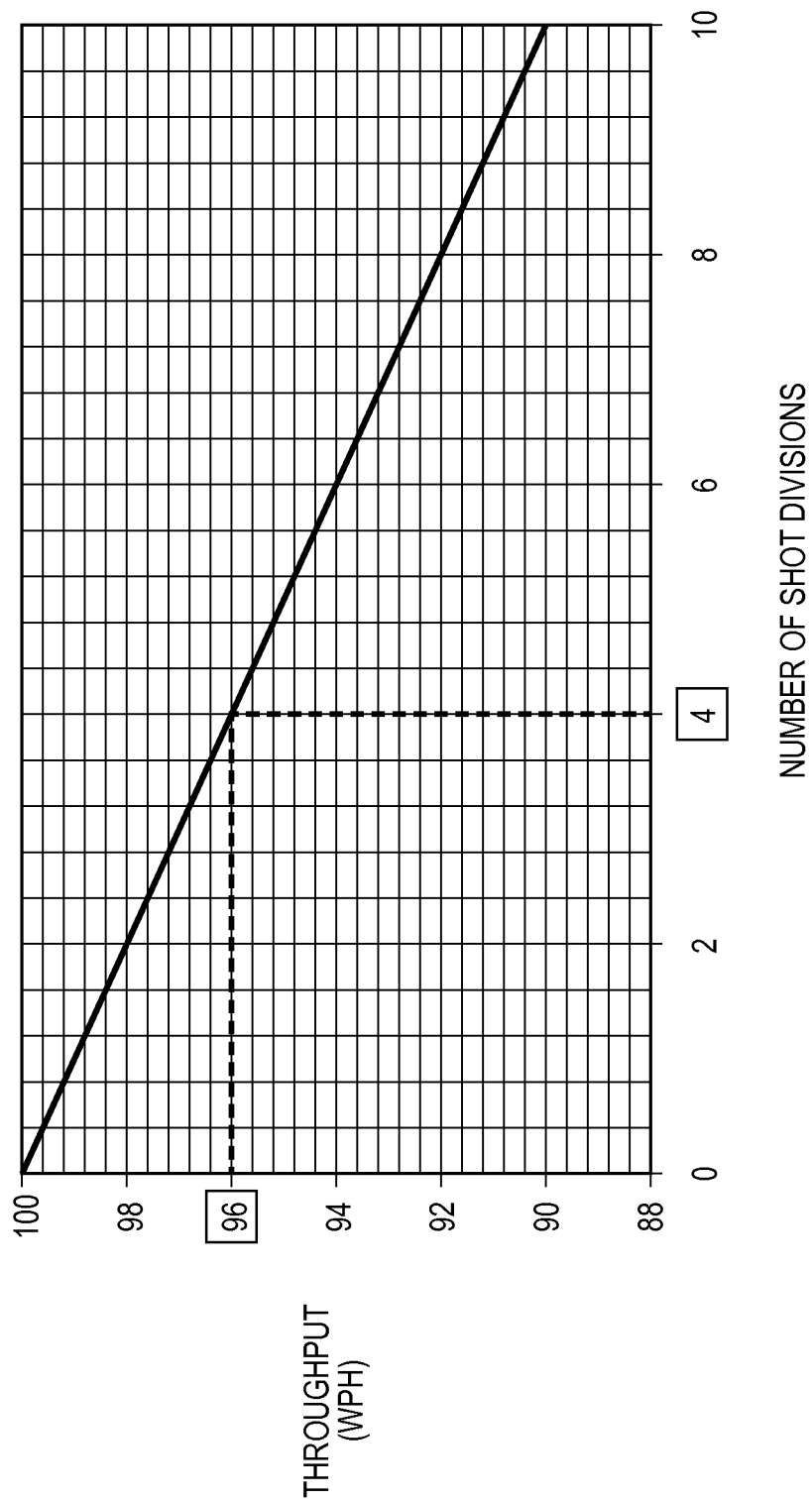
FIG. 6 is a graph illustrating a relationship between a number of shot region divisions and throughput/yield.

A second embodiment will be described using FIGS. 1 and 6. In the second embodiment, a function for storing a lower limit value (target range) of throughput for production management is added to the storage unit 23. The main controller 3 loads the lower limit value of the throughput for production management stored in the storage unit 23, and as illustrated in FIG. 6, determines a number of shot region divisions from a relational expression between the number of shot region divisions and the throughput. For example, it can be seen that in the case where the lower limit value of the throughput is 96, the number of shot region divisions that can be carried out is no greater than 4. The main controller 3 then calculates the position deviation amounts in the case where the calculated shot region division is not carried out based on the shapes of the shot regions. Then, from shot regions whose position deviation amounts exceed a position deviation permitted value for production management stored in the storage unit 23, the main controller 3 determines the shot region divisions within a range that does not exceed the number of shot region divisions, and stores a result of the determination in the storage unit 23. The main controller 3 calculates the shapes of the regions obtained by dividing the shot region, the shift (XY)/rotation (θ) correction amounts of the wafer stage 16 corresponding to the respective regions obtained by the division, and the magnification correction amount of the projection optical system 10, and stores this information in the storage unit 23. These processes are carried out in S2 of FIG. 4, and the steps from S2 on are the same as in the first embodiment.

As a variation on the second embodiment, a function for storing another indicator (a yield target value, for example) for production management may be added to the storage unit 23, and the number of shot region divisions may then be determined taking into consideration a relationship between the indicator and the number of shot region divisions. The present embodiment makes it possible to carry out exposure under conditions in which an improvement in yield and throughput are balanced through the divided exposure.

Third Embodiment

Figure 7:
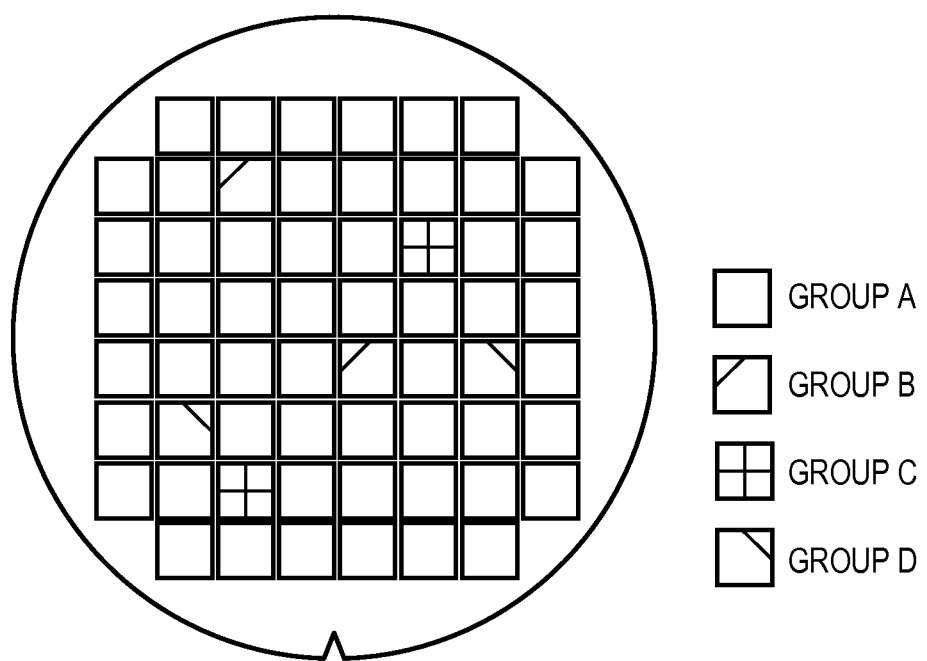
FIG. 7 is a diagram illustrating grouping of shot regions obtained from division.

A third embodiment will be described using FIGS. 4 and 7. FIG. 7 is a schematic diagram in which the shot regions are divided into groups based on the shapes of regions serving as units of exposure, after whether or not to apply divided exposure and the shape of the divisions have been determined for all of the shot regions in S2. Group A is a group to which divided exposure is not applied. Groups B to D are groups including shot regions in which the respective partial regions have the same shapes.

In S3, the main controller 3 selects a shot region to undergo the exposure process from group A, and in S4 to S6, carries out the exposure process on the respective shot regions in the selected group A. When the exposure process ends for all of the shot regions belonging to group A, the main controller 3 then carries out the exposure process on the shot regions in group B. Likewise, the main controller 3 sequentially executes the exposure process of S3 to S7 on group C and D until the exposure process is completed for all shot regions in all groups. The present embodiment makes it possible to carry out divided exposure while reducing a drop in throughput caused by the light-shielding plate, various types of driving for correction, and so on during the divided exposure.

Fourth Embodiment

Next, a manufacturing method for a device (a semiconductor device, a liquid crystal display device, or the like) will be described. The semiconductor device is manufactured through a pre-process of forming an integrated circuit on a wafer and a post-process of completing a chip having the integrated circuit formed on the wafer in the pre-process as a product. The pre-process includes a process of using the aforementioned exposure apparatus to expose a wafer to which a photosensitive agent has been applied, and a process of developing the wafer. The post-process includes an assembly process (dicing, bonding) and a packaging process (enclosure). The liquid crystal display device is manufactured using a process of forming a transparent electrode. The process of forming the transparent electrode includes a process of applying a photosensitive agent to a glass substrate onto which a transparent conductive film has been deposited, a process of using the aforementioned exposure apparatus to expose the glass substrate to which the photosensitive agent has been applied, and a process of developing the glass substrate. According to the device manufacturing method of the present embodiment, a device having a higher quality than conventional devices can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-106457, filed May 22, 2014, which is hereby incorporated by reference herein in its entirety.

What is claimed is:

1. An exposure apparatus for sequentially performing exposure in each of a plurality of underlying shot regions formed on a substrate via a projection optical system that projects a reticle pattern onto the substrate, the apparatus comprising:
a controller configured to control the exposure so as to perform one-shot exposure that exposes one shot region without dividing the one shot region and divided exposure that divides the one shot region into a plurality of partial regions and exposes each of the partial regions separately,
wherein the controller is configured to
determine, for each of the plurality of underlying shot regions, whether to perform the one-shot exposure or the divided exposure, based on information of respective shapes in a plane perpendicular to an optical axis of the projection optical system, of the plurality of underlying shot regions, and
in a case where the divided exposure is determined to be performed, determine shapes of the plurality of partial regions in the one shot region in which the divided exposure is to be performed, and control the exposure so as to perform the divided exposure in each of the partial regions based on the determined shape of each partial region.

2. The exposure apparatus according to claim 1, further comprising:
a magnification adjusting mechanism configured to adjust a magnification of the projection optical system;
a light-shielding portion configured to shield regions other than the partial regions from exposure; and
a stage configured to hold the substrate and movable and rotatable in the plane perpendicular to the optical axis of the projection optical system,
wherein the controller is configured to control the magnification adjusting mechanism, the light-shielding portion, and the stage so as to reduce deviation between a shape of an exposure region adjusted by the light-shielding portion and the shape of the partial regions.

3. The exposure apparatus according to claim 2,
wherein the controller is configured to control the magnification based on the shape of the partial regions and is configured to control at least one of the movement and the rotation of the stage based on the position of the partial regions.

4. The exposure apparatus according to claim 1,
wherein the controller is configured to obtain the information from outside of the exposure apparatus.

5. The exposure apparatus according to claim 1, further comprising:
a measurement device configured to measure the shape of each of the plurality of the shot regions,
wherein the controller is configured to obtain the information from a result of the measurement performed by the measurement device.

6. The exposure apparatus according to claim 5,
wherein the controller is configured to obtain the information from a result of the measurement performed by the measurement device on a first substrate in a lot.

7. The exposure apparatus according to claim 1,
wherein the controller is configured to determine a number and a shape of the partial regions in the shot region in which the divided exposure is performed based on a deviation amount between a shape of the shot region in the case where the shot region is not divided and a shape of the pattern projected onto the substrate.

8. The exposure apparatus according to claim 1,
wherein the controller is configured to determine in how many shot regions the divided exposure is performed so as to fall within a target range in which a time required to expose the plurality of shot regions is set in advance.

9. The exposure apparatus according to claim 1,
wherein the controller is configured to divide the plurality of shot regions into a plurality of groups based on a shape of a region that serves as a unit of exposure, and to sequentially perform exposure in the plurality of shot regions on a group-by-group basis.

10. The exposure apparatus according to claim 1,
wherein the controller is configured to perform the divided exposure in a case where a deviation amount between a shape of the shot region in the case where the shot region is not divided and a shape of the pattern projected onto the substrate does not fall within an allowable rage.

11. The exposure apparatus according to claim 1,
wherein the controller is configured to determine the number of shot regions where the divided exposure is performed, based on a yield target value.

12. An exposure method for sequentially performing exposure in each of a plurality of underlying shot regions formed on a substrate via a projection optical system that projects a reticle pattern onto the substrate, the method comprising:
determining, for each of the plurality of the underlying shot regions, whether to perform one shot exposure that exposes one shot region without dividing the one shot region or divided exposure that divides the one shot region into a plurality of partial regions and exposes each of the partial regions separately, based on information of respective shapes in a plane perpendicular to an optical axis of the projection optical system, of the plurality of underlying shot regions; and
in a case where the divided exposure is determined to be performed, determining shapes of the plurality of partial regions in the one shot region in which the divided exposure is to be performed, and controlling the exposure so as to perform the divided exposure in each of the partial regions based on the determined shape of each partial region.

13. A method of manufacturing a device, the method comprising:

exposing a substrate using an exposure apparatus for sequentially performing exposure in each of a plurality of underlying shot regions formed on a substrate via a projection optical system that projects a reticle pattern onto the substrate;

developing the exposed substrate; and processing the developed substrate to manufacture the device, wherein the exposure apparatus includes a controller configured to control the exposure so as to perform one-shot exposure that exposes one shot region without dividing the one shot region and divided exposure that divides the one shot region into a plurality of partial regions and exposes each of the partial regions separately, wherein the controller is configured to determine, for each of the plurality of underlying shot regions, whether to perform the one-shot exposure or the divided exposure, based on information of respective shapes in a plane perpendicular to an optical axis of the projection optical system, of the plurality of underlying shot regions, and in a case where the divided exposure is determined to be performed, determine shapes of the plurality of partial regions in the one shot region in which the divided exposure is to be performed, and control the exposure so as to perform the divided exposure in each of the partial regions based on the determined shape of each partial region.

* * * * *